(12) United States Patent
Akiba et al.

(10) Patent No.: US 11,289,848 B2
(45) Date of Patent: Mar. 29, 2022

(54) ELECTRONIC CONTROL DEVICE

(71) Applicant: HITACHI AUTOMOTIVE SYSTEMS, LTD., Hitachinaka (JP)

(72) Inventors: Ryo Akiba, Hitachinaka (JP); Yoshio Kawai, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 17/055,496

(22) PCT Filed: Feb. 14, 2019

(86) PCT No.: PCT/JP2019/005221
§ 371 (c)(1),
(2) Date: Nov. 13, 2020

(87) PCT Pub. No.: WO2019/220718
PCT Pub. Date: Nov. 21, 2019

(65) Prior Publication Data
US 2021/0151928 A1 May 20, 2021

(30) Foreign Application Priority Data

May 17, 2018 (JP) .............................. JP2018-095705

(51) Int. Cl.
*H01R 13/52* (2006.01)
*B60R 16/023* (2006.01)

(52) U.S. Cl.
CPC ..... *H01R 13/5219* (2013.01); *B60R 16/0231* (2013.01); *H01R 13/5213* (2013.01)

(58) Field of Classification Search
CPC ............ H01R 13/5219; H01R 13/5213; H01R 13/741; Y10S 439/926; B60R 16/0231; H02G 3/088

See application file for complete search history.

(56) References Cited

U.S. PATENT DOCUMENTS

| 2002/0142630 | A1* | 10/2002 | Molus | H02G 3/088 |
| | | | | 439/76.1 |
| 2015/0009640 | A1* | 1/2015 | Stern | H01R 13/6658 |
| | | | | 361/752 |
| 2017/0324188 | A1* | 11/2017 | Guo | H01R 13/5202 |

FOREIGN PATENT DOCUMENTS

| JP | 2009-186393 A | 8/2009 |
| JP | 2011-47447 A | 3/2011 |

(Continued)

OTHER PUBLICATIONS

International Search Report with English translation and Written Opinion issued in corresponding application No. PCT/JP2019/005221 dated May 21, 2019.

(Continued)

*Primary Examiner* — Tho D Ta
(74) *Attorney, Agent, or Firm* — Foley & Lardner LLP

(57) ABSTRACT

The maximum value of the reaction force generated on the circuit substrate can be reduced.

An electronic control device includes a cover having a hollow opening; a connector inserted into the opening; and a seal member having compressibility that is arranged in contact with a first position of an inner peripheral portion of the opening and that comes into close contact with the inner peripheral portion of the opening and the connector in a compressed state; where the opening has a thickness in a first direction penetrating through the hollow of the opening; an area of a hollow region which is a hollow region of the opening is reduced or maintained along the first direction; the seal member is arranged on an outer peripheral portion of the connector and inserted in the first direction to the opening together with the connector; and an area of the hollow region at the first position is smaller than an area of the hollow region at an entrance of the opening in the first direction.

7 Claims, 23 Drawing Sheets

(56) References Cited

FOREIGN PATENT DOCUMENTS

| | | |
|---|---|---|
| JP | 2012-114052 A | 6/2012 |
| JP | 2012-124992 A | 6/2012 |
| JP | 2013-152815 A | 8/2013 |
| JP | 2013-218870 A | 10/2013 |

OTHER PUBLICATIONS

Office Action issued in corresponding Japanese Patent Application No. 2020-518983 dated Nov. 24, 2021 with English machine translation.

* cited by examiner (a)

(b)

(c)

ELECTRONIC CONTROL DEVICE

TECHNICAL FIELD

The present invention relates to an electronic control device.

BACKGROUND ART

In recent years, the number of parts mounted on a vehicle has been increasing with the electronic electrification and automatic driving of automobiles. On the other hand, there are situations where there is a need to further reduce the vehicle price in order to secure competitiveness with other companies. Therefore, demands for cost reduction of electronic control devices are becoming more and more severe. On the other hand, the electronic control device has been conventionally mounted on the vehicle body frame, but in recent years, it has been required to be directly mounted on the in-vehicle transmission. This is to reduce vehicle cost and weight by reducing the harness between the in-vehicle transmission and the electronic control device, and to expand the mounting space for other electronic components. According to such a background, there is a need for an inexpensive electronic control device that can handle severe temperature environment and vibration environment. PTL 1 discloses an electronic device that includes a circuit substrate; a connector mounted on the circuit substrate; a housing that interiorly accommodates the circuit substrate and has an opening that exposes a part of the connector to the outside; and a grommet mounted in a gap to ensure the waterproofness of the gap between the connector and the opening of the housing; where the grommet includes an annular seal portion that abuts the outer peripheral surface of the connector and the surface of the periphery of the opening of the housing, and a latch portion that is inserted into the gap between the opening and the connector to lock the seal portion with the opening of the housing; and the latch part is elastically deformable in a direction connecting the opening and the connector.

CITATION LIST

Patent Literature

PTL 1: JP 2012-124992 A

SUMMARY OF INVENTION

Technical Problem

In the invention described in PTL 1, the reaction force generated on the circuit substrate is large.

Solution to Problem

An electronic control device according to a first aspect of the present invention relates to an electronic control device including a cover having a hollow opening; a connector inserted into the opening; and a seal member having compressibility that is arranged in contact with a first position of an inner peripheral portion of the opening and that comes into close contact with the inner peripheral portion of the opening and the connector in a compressed state; where the opening has a thickness in a first direction which is a direction in which the connector is inserted, an area of a hollow region which is a hollow region of the opening is reduced or maintained along the first direction, the seal member is arranged on an outer peripheral portion of the connector and inserted in the first direction to the opening together with the connector, and an area of the hollow region at the first position is smaller than an area of the hollow region at an entrance of the opening in the first direction.

Advantageous Effects of Invention

According to the present invention, the maximum value of the reaction force generated on the circuit substrate can be reduced.

BRIEF DESCRIPTION OF DRAWINGS

FIG. 19 is a view in which FIG. 18 is rotated by 180 degrees around the Z axis.

FIG. 21 is a view in which FIG. 20 is rotated by 180 degrees around the Z axis.

DESCRIPTION OF EMBODIMENTS

First Embodiment

Hereinafter, a first embodiment of an electronic control device according to the present invention will be described with reference to FIGS. 1 to 11. The X axis, Y axis, and Z axis shown in each drawing are common.

Figure 1:
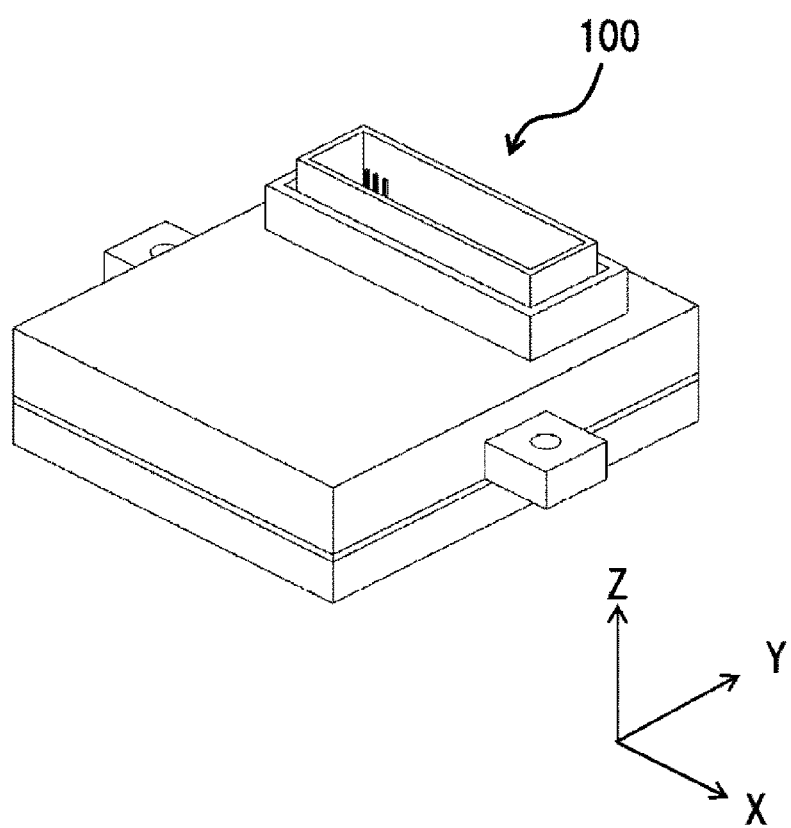
FIG. 1 is a perspective view of an electronic control device 100 according to a first embodiment.
Figure 2:
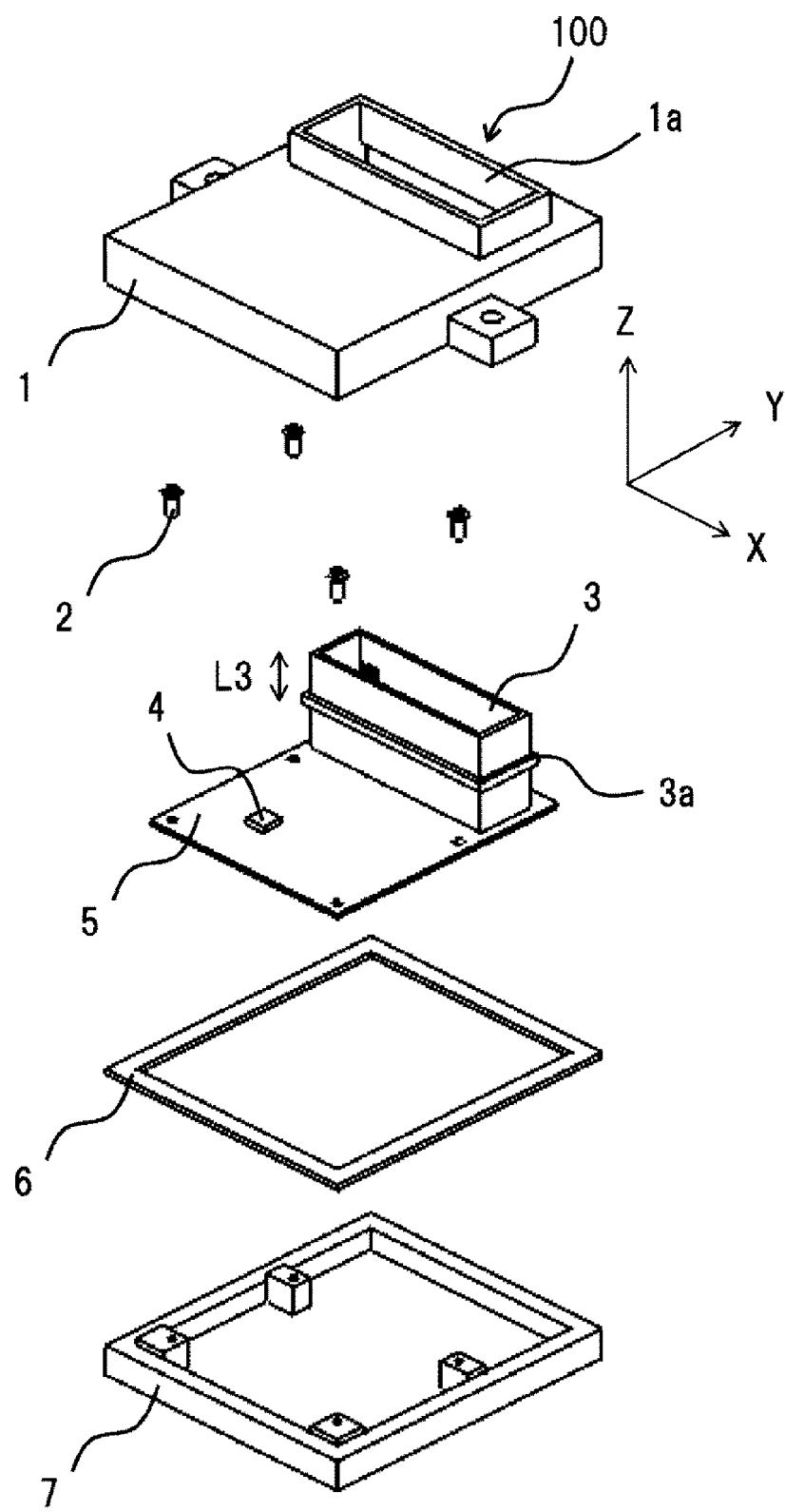
FIG. 2 is an exploded perspective view of the electronic control device 100 according to the first embodiment.

FIG. 1 is a perspective view of an electronic control device 100, and FIG. 2 is an exploded perspective view of the electronic control device 100. In other words, FIG. 1 shows a completed state of the electronic control device 100, and FIG. 2 shows a state before the electronic control device 100 is assembled. The electronic control device 100 includes a connector 3 and is connected to a connector (not shown) corresponding to the shape of the connector 3. The electronic control device 100 is mounted on, for example, an automobile and controls an engine, a transmission, a brake, and the like. The electronic control device 100 is configured by stacking a cover 1, a circuit substrate 5, and a base 7 in the Z direction as shown in FIG. 2.

The cover 1 has an opening 1a. As shown in FIG. 2, the opening 1a is hollow and has a thickness in the Z direction that penetrates the hollow. Hereinafter, the region of the hollow portion of the opening 1a, in other words, the region on the inner side of the opening 1a is referred to as a "hollow region". The connector 3 and the electronic component 4 are mounted on the circuit substrate 5. The connector 3 electrically connects an electric circuit formed on the circuit substrate 5 and an external device of the electronic control device 100. The circuit substrate 5 is first fixed to the base 7 with a screw 2 while a face seal member 6 is arranged between the circuit substrate 5 and the base 7, and then connected to the cover 1. In order to connect the circuit substrate 5 and the cover 1, it is necessary to insert the connector 3 into the opening 1a.

A seal member 3a is arranged on the outer peripheral portion of the connector 3. The connector 3 and the seal member 3a are integrally inserted into the opening 1a in the positive direction of the Z axis. Thus, the inner peripheral surface of the opening 1a and the outer peripheral portion of the connector 3 come into close contact with each other through the seal member 3a. The airtightness of the electronic control device 100 is ensured by the seal member 3a and the face seal member 6 described above. The insertion of the connector 3 into the opening 1 will be described in detail later. In the description below, the distance from the tip of the connector 3 to the upper end of the seal member 3a is referred to as L3.

In addition to the illustrated electronic component 4, a plurality of various electronic components are mounted on the circuit substrate 5. The seal member 3a is a material having compressibility, and a rubber-based material or a CIPG (Cured in Place Gasket) material can be used. Specifically, the seal member 3a is a compressible solid, such as acrylic rubber, silicone rubber, fluororubber, nitrile rubber, polyamide resin, acrylic resin, silicone resin, and fluororesin.

In the present embodiment, the initial state of the seal member 3a, that is, the thickness before the assembly in which the cover 1 and the circuit substrate 5 are separated as shown in FIG. 2 is referred to as an "initial thickness t0", and the thickness of the seal member 3a in the completed state is referred to as a "final thickness t1".

Figure 3:
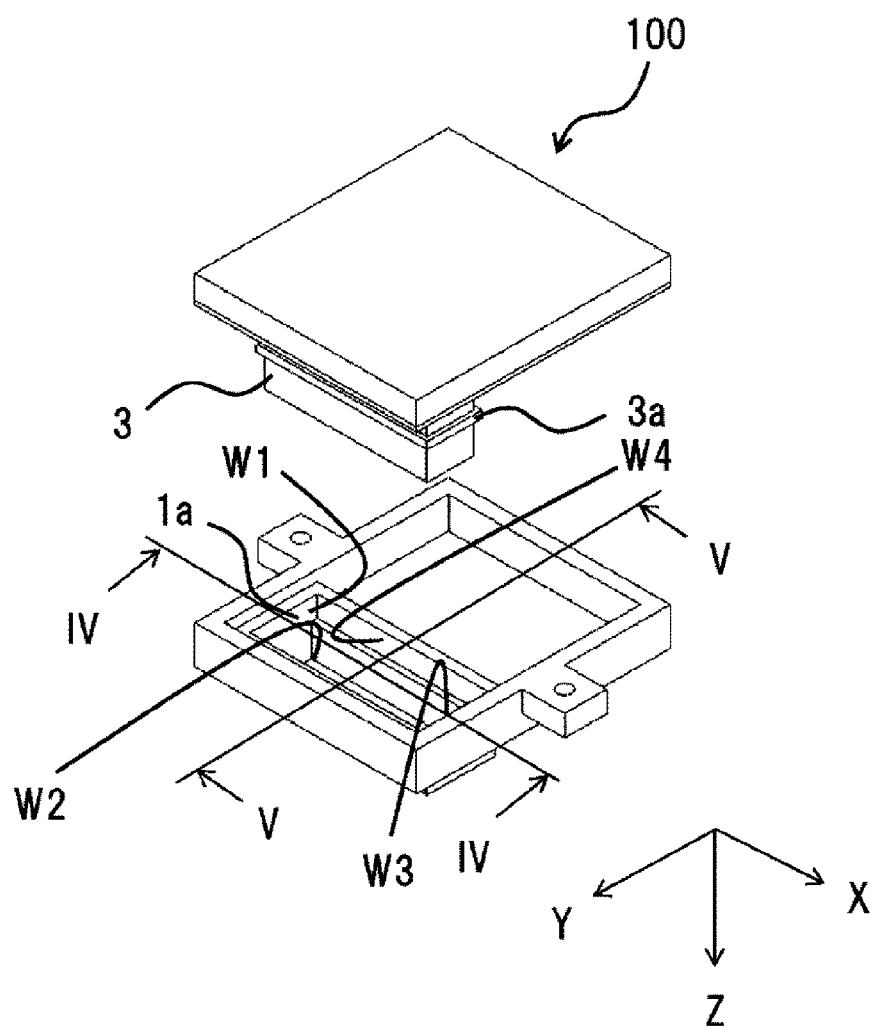
FIG. 3 is a perspective view in which only a cover 1 of the electronic control device 100 according to the first embodiment is separated.

FIG. 3 is a perspective view in which only the cover 1 of the electronic control device 100 is separated. However, FIG. 3 is turned upside down from FIGS. 1 and 2. Hereinafter, the respective wall surfaces on the inner peripheral side of the opening 1a are referred to as a first wall surface W1, a second wall surface W2, a third wall surface W3, and a fourth wall surface W4. The first wall surface W1 and the third wall surface W3 are surfaces perpendicular to the X axis, and the first wall surface W1 has a smaller X coordinate value than the third wall surface W3. The second wall surface W2 and the fourth wall surface W4 are surfaces perpendicular to the Y axis, and the second wall surface W2 has a larger Y coordinate value than the fourth wall surface W4. In the present embodiment, the first wall surface W1 and the third wall surface W3 have the same shape, and the second wall surface W2 and the fourth wall surface W4 have the same shape. A cross-section that is perpendicular to the Y axis and passes through the center of the opening 1a in the Y direction is referred to as an IV-IV cross-section. A cross-section that is perpendicular to the X axis and passes through the center of the opening 1a in the X direction is referred to as a V-V cross-section.

Figure 4:
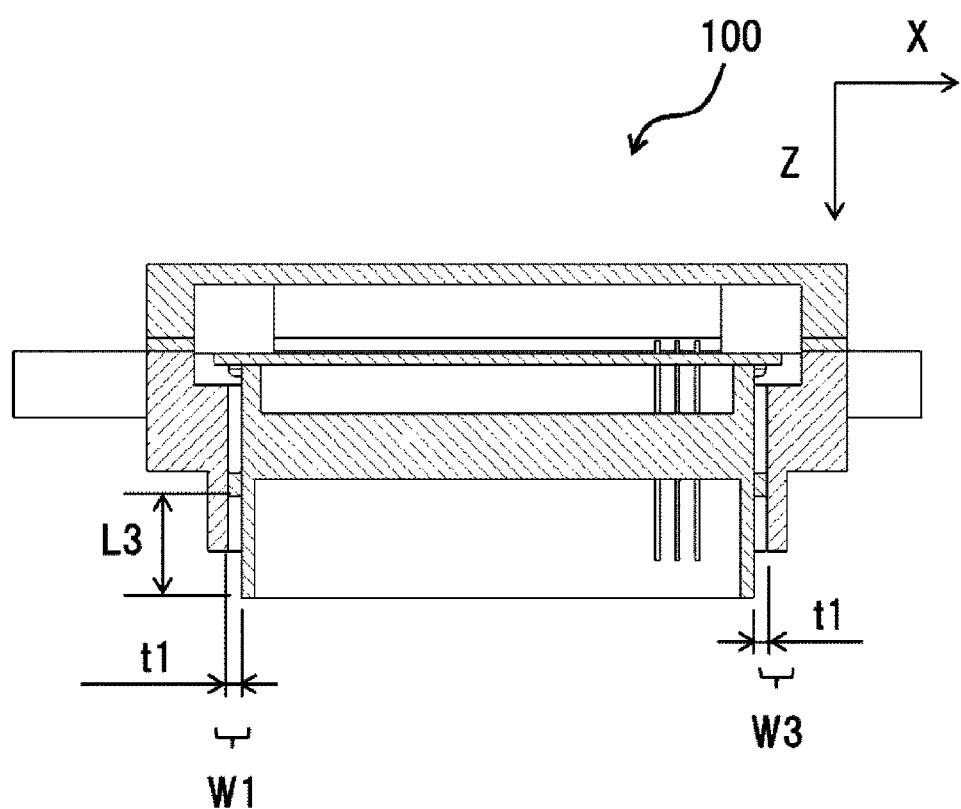
FIG. 4 is a cross-sectional view taken along line IV-IV in FIG. 3.

FIG. 4 is a cross-sectional view of the electronic control device 100 taken along the IV-IV cross-section in FIG. 3. However, although the cover 1 is separated from the electronic control device 100 in FIG. 3, the cover 1 is coupled to the electronic control device 100 in FIG. 4. In FIG. 4, the first wall surface W1 is shown on the left side of the drawing, and the third wall surface W3 is shown on the right side of the drawing. The distance between the first wall surface W1 and the third wall surface W3 and the outer peripheral portion of the connector 3, in other words, the distance between the first wall surface W1 and the third wall surface W3 in the X direction is constant regardless of the Z direction. Furthermore, the distance between the first wall surface W1 and the third wall surface W3 and the outer peripheral portion of the connector 3 is equal to the final thickness t1, which is the thickness of the seal member 3a in the completed state.

Figure 5:
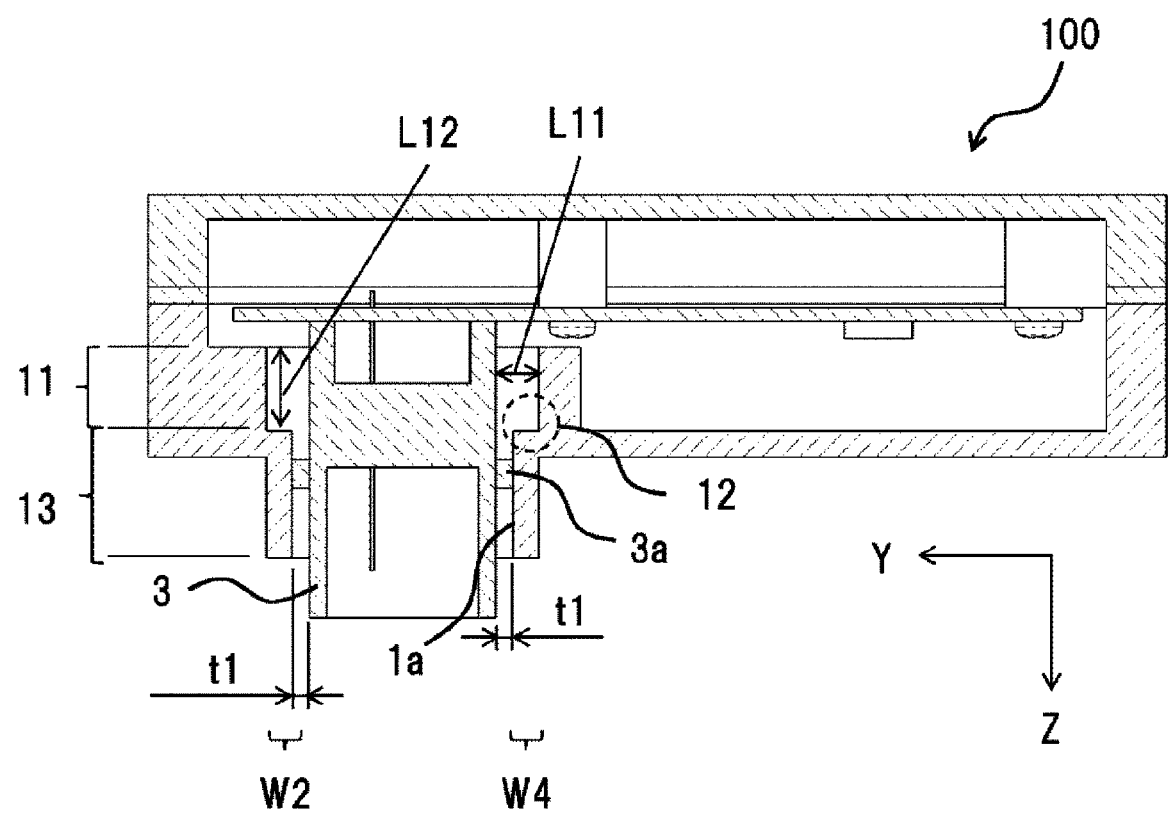
FIG. 5 is a cross-sectional view taken along line V-V in FIG. 3.

FIG. 5 is a cross-sectional view of the electronic control device 100 taken along the V-V cross-section in FIG. 3. However, although the cover 1 is separated from the electronic control device 100 in FIG. 3, the cover 1 is coupled to the electronic control device 100 in FIG. 5. As shown in FIG. 5, the second wall surface W2 and the fourth wall surface W4 include a wide-width portion 11 having a wide width in the cross-section of FIG. 5, a narrow-width portion 13 having a narrow width in the cross-section of FIG. 5, and a step portion 12 that connects the wide-width portion 11 and the narrow-width portion 13. Since the shape of the cross-section shown in FIG. 4 is constant with respect to the change in the Z direction, the opening area of the opening 1a varies depending on the width shown in FIG. 5, and the opening area of the opening 1a is wider at the upper part of the drawing and narrower at the lower part of the drawing.

The opening area of the wide-width portion 11 and the narrow-width portion 13 is constant with respect to the change in the Z direction, and the opening area of the step portion 12 decreases in the positive direction of the Z axis. In other words, the opening area of the opening 1a monotonically decreases in the positive direction of the Z axis. The "monotonic decrease" referred to here is not a monotonous decrease in a narrow sense in which the decrease always continues, but a monotonous decrease in a broad sense that includes a decrease and maintenance of the current situation. In the following, the upper end of the wide-width portion 11 in the drawing, that is, the end on the negative side in the Z direction will also be referred to as the entrance of the opening 1a in the Z direction.

The distance L11 between the connector 3 and the inner peripheral surface of the opening 1a in the wide-width portion 11 is longer than the initial thickness t0 which is the thickness of the seal member 3a in the initial state. Therefore, when inserting the connector 3 into the opening 1a, the wide-width portions 11 of the second wall surface W2 and the fourth wall surface W4 do not come into contact with the seal member 3a. In the description below, the length of the wide-width portion 11 in the Z direction will be referred to as L12.

Figure 6:
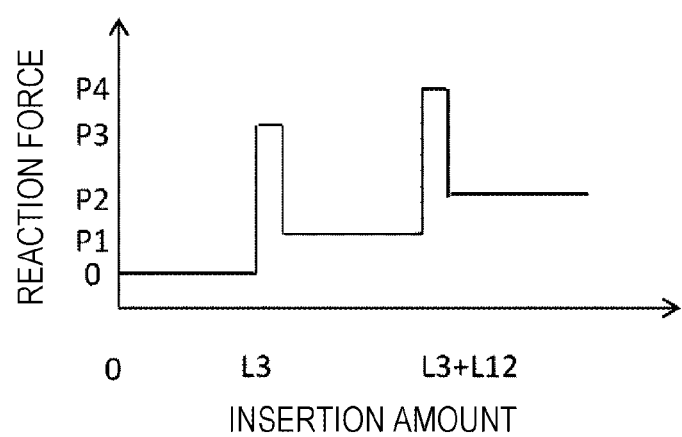
FIG. 6 is a conceptual diagram showing a schematic relationship between the insertion amount of the connector 3 into the opening 1a and the reaction force in the first embodiment.
Figure 7:
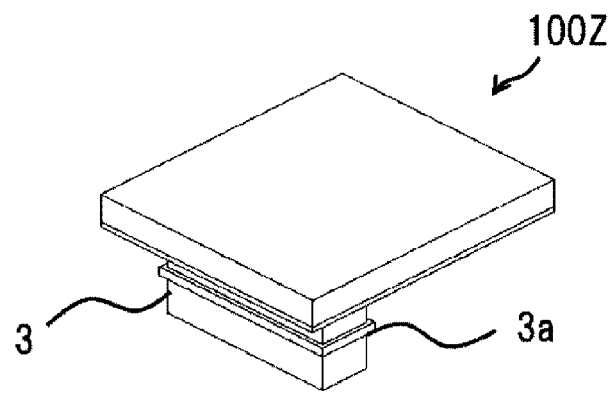
FIG. 7(a) is an exploded perspective view of a comparative example device 100Z.
FIG. 7(b) is a bb cross-sectional view of the comparative example device 100Z.
FIG. 7(c) is a cc cross-sectional view of the comparative example device 100Z.
Figure 7:
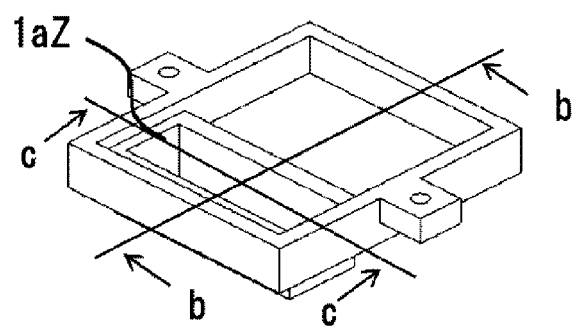
Figure 7:
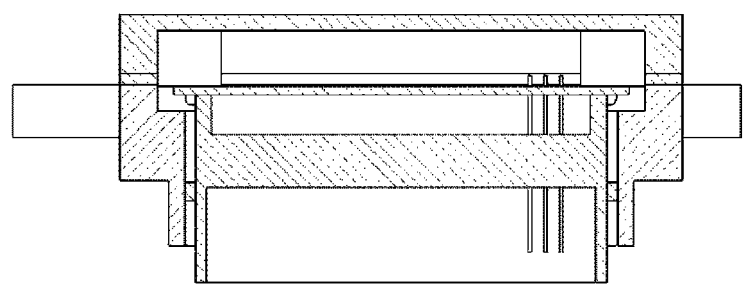

FIG. 6 is a conceptual diagram showing a schematic relationship between the insertion amount of the connector 3 into the opening 1a and the reaction force received by the connector 3 due to the insertion in the process of manufacturing the electronic control device 100. However, in FIG. 6, the insertion amount is zero in a state where the tip of the connector 3 is in contact with the entrance of the opening 1a. Furthermore, P1 to P4 indicating the magnitude of the reaction force in FIG. 6 indicate that the reaction force is larger the larger the number.

The relationship between the insertion amount and the reaction force shown in FIG. 6 is as follows. The reaction force is zero until the insertion amount reaches L3, and the reaction force temporarily becomes P3 at L3. Thereafter, the reaction force decreases to P1, and P1 continues until the insertion amount reaches L3+L12. When the insertion amount becomes L3+L12, the reaction force becomes P4, which is the maximum in the range shown in FIG. 6, and then decreases and P3 continues.

Next, the relationship between the insertion amount and the reaction force shown in FIG. 6 will be described. Since the distance from the tip of the connector 3 to the seal member 3a is L3, the seal member 3a does not come into contact with the inner peripheral surface of the opening 1a when the insertion amount is less than L3. Therefore, the reaction force is zero when the insertion amount is less than L3. In a state where the insertion amount is L3, the first wall surface W1 and the third wall surface W3 are in contact with the seal member 3a. When a force is applied to the connector 3 in the positive direction of the Z-axis in a state where they are in contact with each other, the seal member 3a in contact with the first wall surface W1 and the third wall surface W3 is compressed and crushed, and the seal member 3a advances inside the opening 1a. The reaction force of the force required to compress the seal member 3a in contact with the first wall surface W1 and the third wall surface W3 is P3. Thereafter, the first wall surface W1 and the third wall surface W3 and the seal member 3a are in close contact with each other, so that the reaction force P1 is generated by friction.

When the insertion of the connector 3 is further advanced and the insertion amount becomes L3+L12, the seal member 3a reaches the step portion 12. In this state, the seal member 3a comes into contact with not only the first wall surface W1 and the third wall surface W3 but also with the second wall surface W2 and the fourth wall surface W4. When a force is applied to the connector 3 in the positive direction of the Z-axis in this state, the seal member 3a in contact with the second wall surface W2 and the fourth wall surface W4 is compressed and crushed, and the seal member 3a further advances inside the opening 1a. The total of the reaction force of the force required for the compression of the seal member 3a in contact with the second wall surface W2 and the fourth wall surface W4 and the frictional force of the seal member 3a in contact with the first wall surface W1 and the third wall surface W3 is P4. Thereafter, the entire periphery of the seal member 3a comes into close contact with the inner peripheral portion of the opening 1a, and thus the reaction force P3 is generated by friction.

Thus, in the present embodiment, the compression of the seal member 3a is performed in two stages, and thus an excessive reaction force can be prevented from being generated. The reaction force received by the connector 3 damages the circuit substrate 5 on which the connector 3 is mounted, and causes for example, peeling of electronic components, cracking of solder, and the like. Since such a problem becomes more remarkable as the reaction force increases, the influence can be suppressed by dispersing the reaction force in two stages as in the present embodiment.

Comparative Example

A comparative example device 100Z, which is a comparative example, has substantially the same shape and dimensions as the electronic control device 100, but has a different opening shape. The material of each component of the comparative example device 100Z is the same as that of the electronic control device 100. FIG. 7(a) is an exploded perspective view of the comparative example device 100Z, FIG. 7(b) is a bb cross-sectional view of the comparative example device 100Z, and FIG. 7(c) is a cc cross-sectional view of the comparative example device 100Z. When showing the correspondence between the comparative example device 100Z and the electronic control device 100, FIG. 7(a) corresponds to FIG. 3, FIG. 7(b) corresponds to FIG. 4, and FIG. 7(c) corresponds to FIG. 5. Note that FIG. 7(b) is the same as FIG. 4.

As shown in FIGS. 7(b) and 7(c), a comparative example opening 1aZ of the comparative example device 100Z does not have the step portion 12 like the electronic control device 100 and is uniform. That is, the opening area of the comparative example opening 1aZ is always constant regardless of the Z direction. Therefore, in the assembly process of the comparative example device 100Z, when the connector is inserted into the comparative example opening 1aZ, all sides of the comparative example opening 1aZ simultaneously comes into contact with the seal member 3a in the uncompressed state, and the entire seal member 3a is compressed.

Figure 8:
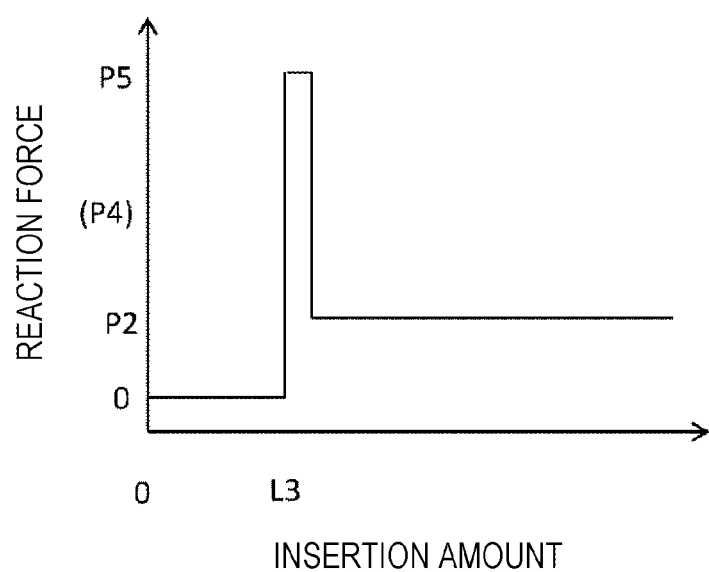
FIG. 8 is a conceptual diagram showing a schematic relationship between the insertion amount of the connector 3 into a comparative example opening 1aZ and the reaction force in the comparative example.

FIG. 8 is a conceptual diagram showing a schematic relationship between the insertion amount of the connector 3 into the comparative example opening 1aZ and the reaction force received by the connector 3 due to the insertion in the process of manufacturing the comparative example device 100Z. However, in FIG. 8, the insertion amount is zero in a state where the tip of the connector 3 is in contact with the entrance of the comparative example opening 1aZ. Furthermore, P3 showing the magnitude of the reaction force in FIG. 8 is the same as P3 shown in FIG. 6. Moreover, the reaction force P5 shown in FIG. 8 is a value larger than P4 shown in FIG. 6.

The relationship between the insertion amount and the reaction force shown in FIG. 8 is as follows. The reaction force is zero until the insertion amount reaches L3, and the reaction force temporarily becomes P5 at L3. Thereafter, the reaction force decreases and P3 continues. In the comparative example device 100Z, when the insertion amount is L3, the entire periphery of the comparative example opening 1aZ and the seal member 3a come into contact with each other and the entire periphery of the seal member 3a is compressed. At this time, the reaction force of the force required for compression is P5, which is a value larger than P3 and P4 described above. Therefore, in the comparative example, the maximum value of the reaction force is large, and problems such as peeling of electronic components, cracking of solder, and the like are likely to occur.

The first embodiment described above has the following operation effects.

(1) The electronic control device 100 includes a cover having a hollow opening 1a, a connector 3 inserted into the inner peripheral portion of the opening 1a, and a seal member 3a having compressibility that is arranged in contact with the position of the completed state shown in FIGS. 4 and 5 of the inner peripheral portion of the opening 1a and that is in close contact with the inner peripheral portion of the opening 1a and the connector 3 in a compressed state.

The opening 1a has a thickness in the Z direction, which is the direction in which the connector 3 is inserted.

The area of the hollow region, which is a hollow region of the opening 1a, is reduced or maintained along the Z direction. The seal member 3a is arranged on the outer peripheral portion of the connector 3 and is inserted into the opening 1a in the Z direction together with the connector. As shown in FIG. 5, the area of the hollow region at the position of the completed state is smaller than the area of the hollow region at the entrance of the opening 1a in the Z direction. Therefore, as in the comparative example device 100Z, it is possible to prevent the seal member 3a from being compressed at one time and generating a large reaction force at the entrance of the opening 1a. In other words, the electronic control device 100 can reduce the maximum value of the reaction force generated in the circuit substrate 5. A large reaction force on the circuit substrate 5 causes peeling of electronic components, cracking of solder, and the like, and thus the electronic control device 100 in the present embodiment has less adverse effects on the circuit substrate 5 than the comparative example device 100Z and can improve the connection reliability of the solder used in the circuit substrate 5.

(2) The shape of the inner peripheral portion of the opening 1a, that is, the second wall surface W2 and the fourth wall surface W4 has a plane symmetrical shape with a plane including the Z direction and the X direction and passing through the center of the opening 1a in the Y direction as a plane of symmetry. Therefore, when the connector 3 is inserted into the opening 1a, it can be pressed uniformly from both sides.

(3) The hollow region of the opening 1a has a spread in the X direction and the Y direction. Comparing the hollow region of the opening 1a at the entrance in the Z direction and the region of the outer shape of the uncompressed seal member 3a arranged on the outer periphery of the connector 3, the seal member 3a is longer in the X direction, but the hollow region is longer in the Y direction. Therefore, at the entrance of the opening 1a, the seal member 3a in contact with the first wall surface W1 and the third wall surface W3 is compressed first, and the seal member 3a corresponding to the second wall surface W2 and the fourth wall surface W4 is not compressed. That is, not all the seal member 3a is compressed at least at the entrance of the opening 1a.

First Modified Example

A step may be provided on the first wall surface W1 and the third wall surface W3 and a step may not be provided on the second wall surface W2 and the fourth wall surface W4. That is, the shapes of the first wall surface W1 and the third wall surface W3 and the shapes of the second wall surface W2 and the fourth wall surface W4 may be exchanged.

Second Embodiment

A second embodiment of the electronic control device will be described with reference to FIGS. 9 to 12.

In the following description, the same reference numerals are denoted on the same components as those of the first embodiment, and the differences will be mainly described. The points that are not particularly described are the same as those in the first embodiment. The present embodiment is different from the first embodiment mainly in that the wall surface of a part of the opening 1a has an inclination.

Figure 9:
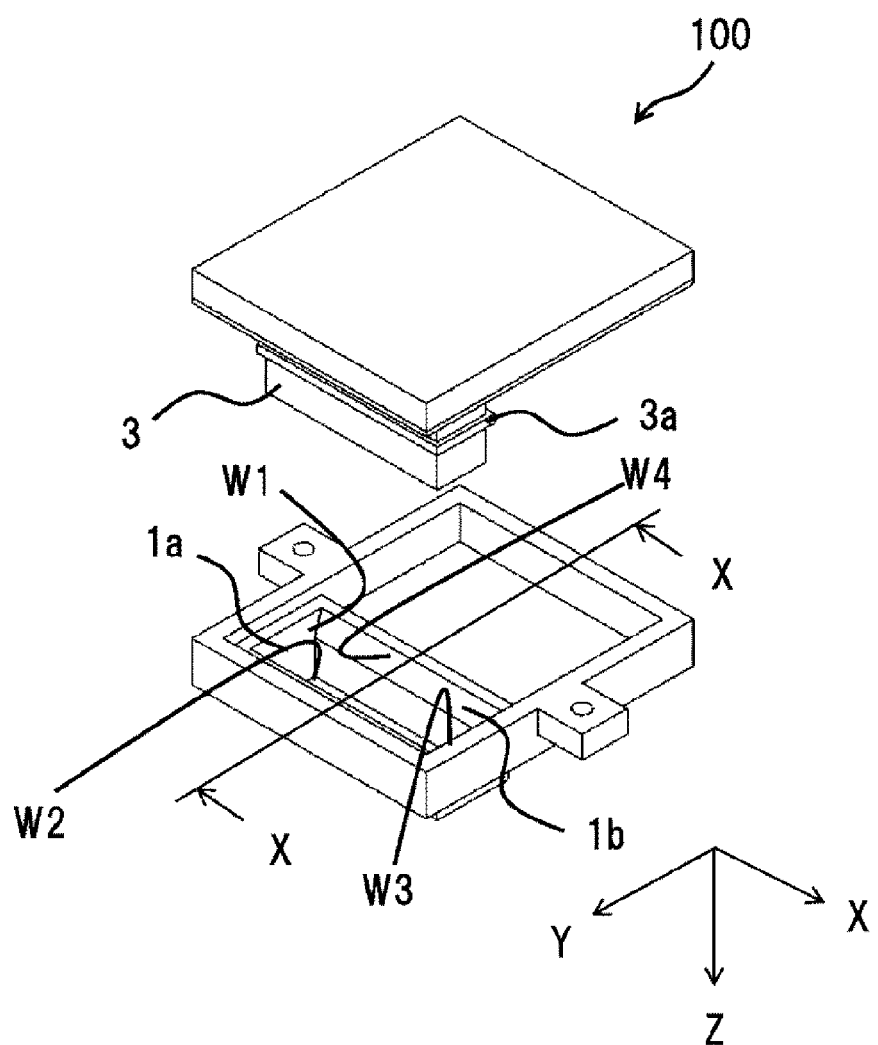
FIG. 9 is a perspective view in which only the cover 1 of the electronic control device 100 according to a second embodiment is separated.

FIG. 9 is a perspective view in which only the cover 1 of the electronic control device 100 according to the second embodiment is separated. That is, FIG. 9 corresponds to FIG. 3 in the first embodiment. The first wall surface W1 and the third wall surface W3 are the same as those in the first embodiment, and the second wall surface W2 and the fourth wall surface W4 are different from those in the first embodiment. The shapes of the second wall surface W2 and the fourth wall surface W4 will be described with reference to FIG. 10 below. A cross-section perpendicular to the X axis and passing through the center of the opening 1a in the X direction will be referred to as an X-X cross-section.

Figure 10:
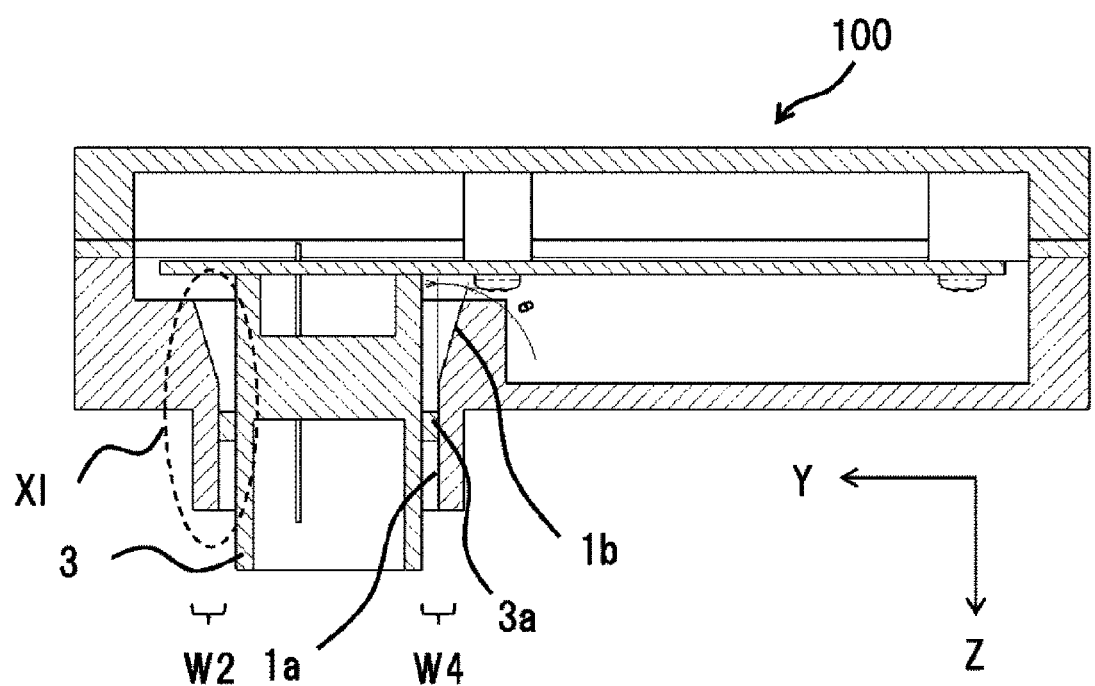
FIG. 10 is a cross-sectional view taken along X-X cross-section in FIG. 9.

FIG. 10 is a cross-sectional view taken along X-X cross-section in FIG. 9. FIG. 10 corresponds to FIG. 5 in the first embodiment. The second wall surface W2 and the fourth wall surface W4 have an inclined surface 1b. The angle θ of the inclined surface 1b is arbitrary and is, for example, 5 degrees.

Figure 11:
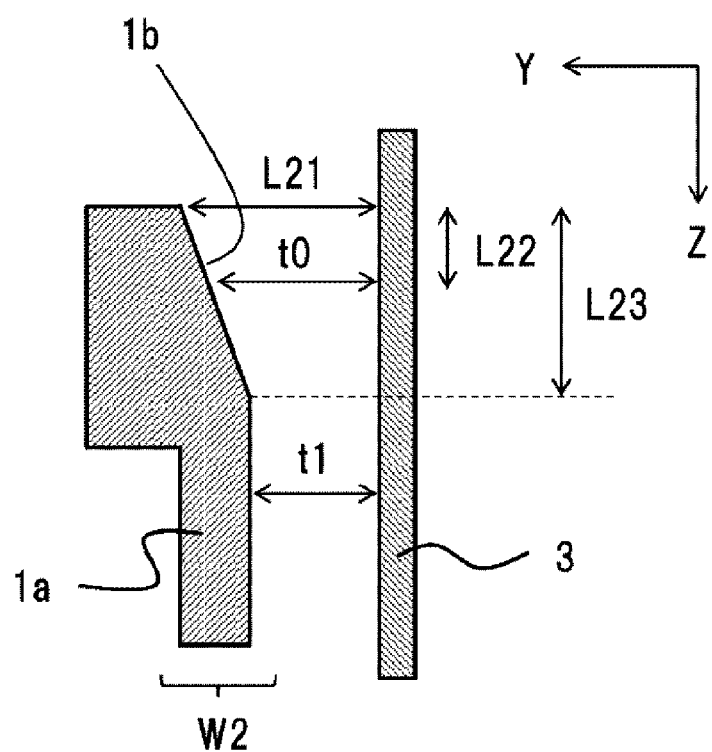
FIG. 11 is an enlarged view of the periphery of the hypotenuse portion 1b.

FIG. 11 is an enlarged view of the periphery of the hypotenuse portion 1b. The distance L21 to the connector 3 at the entrance of the opening 1a which is the upper end of the hypotenuse surface 1b in the figure is longer than the initial thickness t0 of the seal member 3a. The distance to the connector 3 at a position advanced by the distance L22 toward the positive side in the Z axis from the upper end of the hypotenuse surface 1b is equal to the initial thickness t0 of the seal member 3a. From there, in the positive direction of the Z-axis, the interval between the hypotenuse portion 1b and the connector 3 becomes narrower, the interval continues to decrease from the upper end of the hypotenuse portion 1b to the position of the distance L23, and finally it becomes equal to the final thickness t1 of the seal member 3a.

That is, the area of the hollow region continuously decreases in the zone of the distance L23 in the Z direction from the entrance of the opening 1a.

Figure 12:
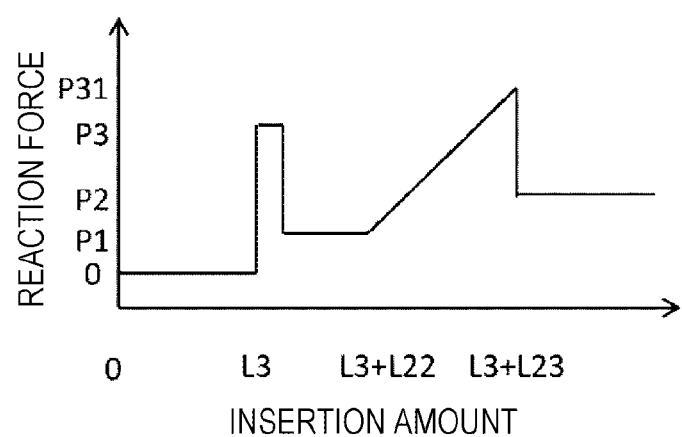
FIG. 12 is a conceptual diagram showing a schematic relationship between the insertion amount of the connector 3 into the opening 1a and the reaction force in the second embodiment.

FIG. 12 is a conceptual diagram showing a schematic relationship between the insertion amount of the connector 3 into the opening 1a and the reaction force received by the connector 3 due to the insertion in the process of manufacturing the electronic control device 100 according to the second embodiment. FIG. 12 corresponds to FIG. 6 of the first embodiment. Until the insertion amount exceeds L3, the description will be omitted because it is the same as in the first embodiment. When the insertion amount reaches L3+L22, the seal member 3a in the initial state comes into contact with the hypotenuse portions 1b of the second wall surface W2 and the fourth wall surface W4. Therefore, as the compression amount of the seal member 3a increases with increase in the insertion amount of the connector 3 thereafter, the crushing force and its reaction force are continuously generated. Furthermore, as the contact area between the seal member 3a and the connector 3 also increases with increase in the insertion amount of the connector 3, so the frictional force also increases.

When the insertion amount reaches L3+L23, the interval between the opening 1a and the connector 3 is constant thereafter, so that the compression amount of the seal member 3a does not change and the reaction force is only the frictional force. Therefore, when the insertion amount is L3+L23 or more, the reaction force becomes P2 as in the first embodiment. The maximum reaction force in the second embodiment is P31 immediately before the insertion amount becomes L3+L23, and this value is smaller than the maximum reaction force P4 in the first embodiment. This is because the seal member 3a in contact with the second wall surface W2 and the fourth wall surface W4 was compressed at once in the first embodiment, but is gradually compressed in the present embodiment.

The second embodiment described above has the following operation effect.

(4) The area of the hollow region of the opening 1a continuously decreases in the Z direction in the zone of the distance L23 in the Z direction from the entrance of the opening 1a. Therefore, since the crushing amount of the seal member 3a can be continuously increased in accordance with the increase of the insertion amount of the connector 3 into the opening 1a, the sudden increase of the reaction force can be avoided.

Third Embodiment

A third embodiment of the electronic control device will be described with reference to FIGS. 13 to 15. In the following description, the same reference numerals are denoted on the same components as those of the first embodiment, and the differences will be mainly described. The points that are not particularly described are the same as those in the first embodiment. The present embodiment is different from the first embodiment mainly in that it has a stepped surface described later.

Figure 13:
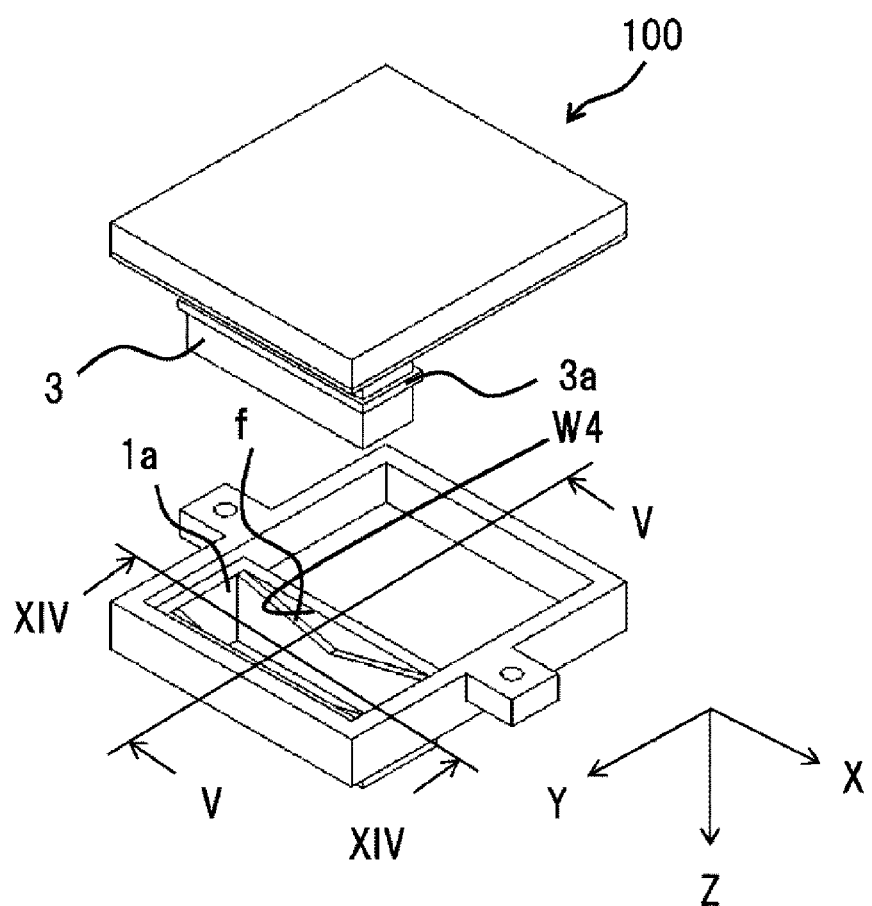
FIG. 13 is a perspective view in which only a cover 1 of the electronic control device 100 according to a third embodiment is separated.

FIG. 13 is a perspective view in which only the cover 1 of the electronic control device 100 according to the third embodiment is separated. That is, FIG. 13 corresponds to FIG. 3 in the first embodiment. The first wall surface W1 and the third wall surface W3 are the same as those in the first embodiment, and the second wall surface W2 and the fourth wall surface W4 are different from those in the first embodiment. The second wall surface W2 and the fourth wall surface W4 have, so to speak, a shape obtained by removing a flat triangular prism from a flat surface, in other words, a stepped surface having a step due to the hypotenuse f. The step will be described in detail with reference to FIGS. 14 and 15. A cross-section that is perpendicular to the X axis and passes through the center of the opening 1a in the X direction is referred to as a V-V cross-section. The shape of this V-V cross section is the same as that of FIG. 5 of the first embodiment. A cross-section that is perpendicular to the Y axis and passes through the center of the opening 1a in the Y direction is referred to as a XIV-XIV cross-section.

Figure 14:
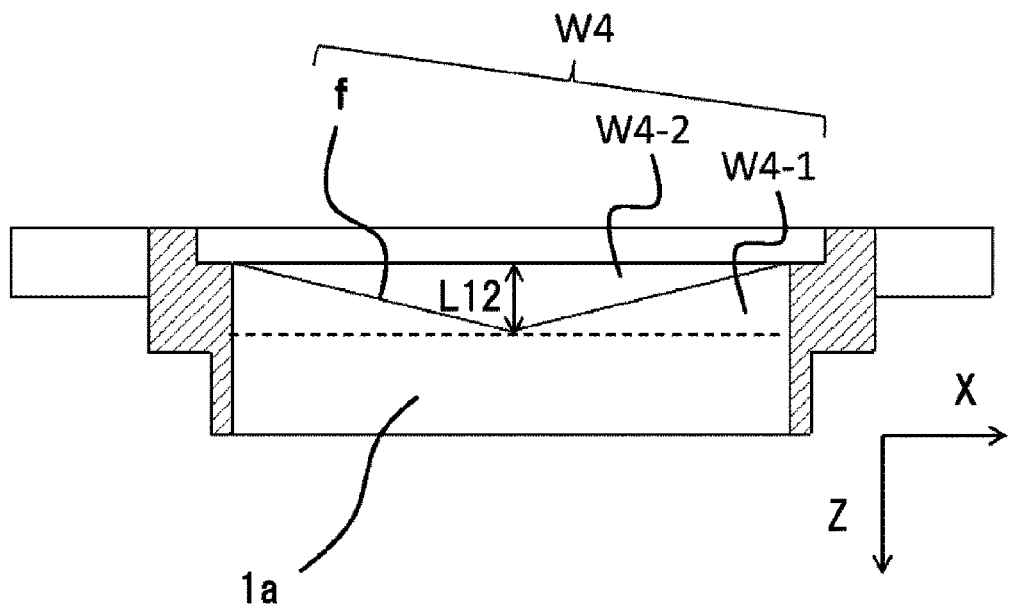
FIG. 14 is a cross-sectional view taken along line XIV-XIV in FIG. 13.

FIG. 14 is a cross-sectional view taken along the XIV-XIV cross-section in FIG. 13, and mainly shows the fourth wall surface W4. As described above, the shape of the second wall surface W2 is the same as the shape of the fourth wall surface W4. The fourth wall surface W4 is divided into two regions by the hypotenuse f, and the depth is constant in each region. The 4-2nd surface W4-2, which is the upper region of the hypotenuse f has more depth than the 4-1st surface W4-1, which is the lower region of the hypotenuse f. The hypotenuse f is a straight line that connects the left and right ends of the upper part of the fourth wall surface W4 in the figure to substantially the center in the height direction of the center in the figure. If the hypotenuse f has a shape like the broken line in the center of the figure, the shape of the opening 1a is the same as that of the first embodiment. Since the hypotenuse f is the boundary between the 4-1st surface W4-1 and the 4-2nd surface W4-2, it can be called a "boundary part".

Figure 15:
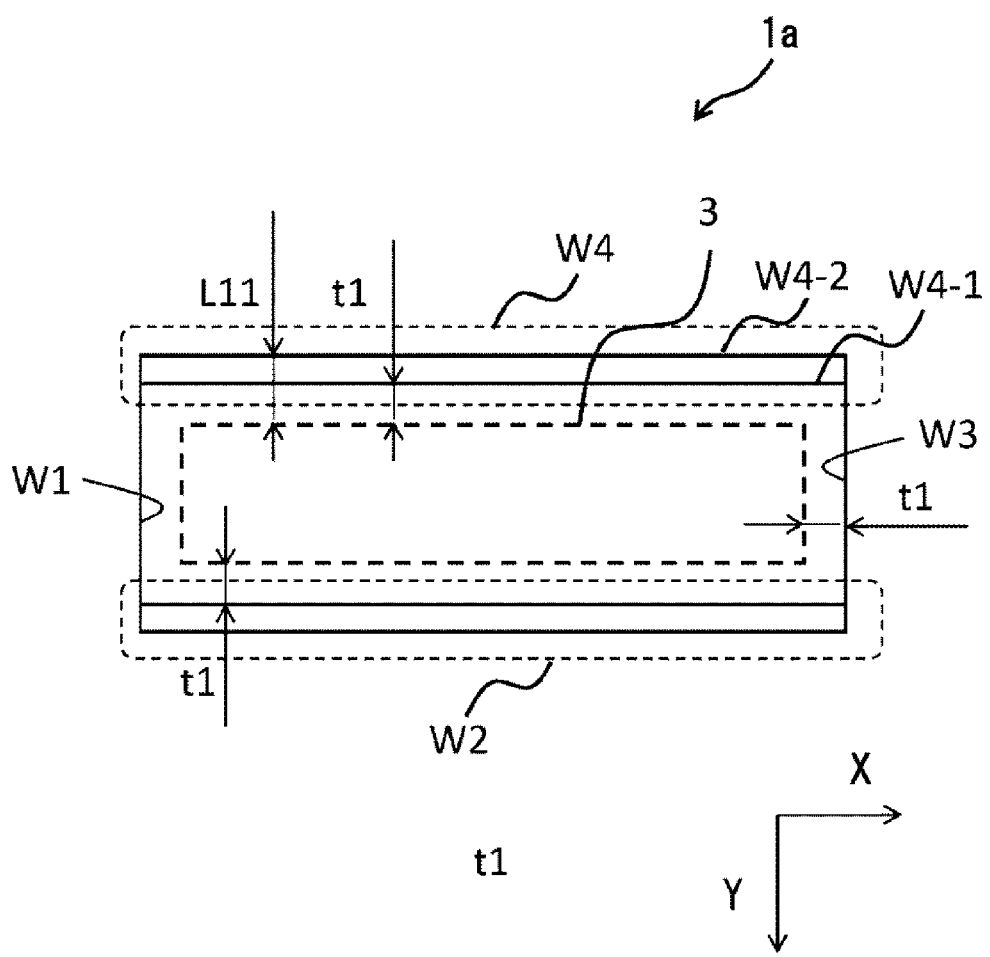
FIG. 15 is a plan view of the opening 1a according to the third embodiment.

FIG. 15 is a plan view of the opening 1a. In FIG. 15, the outer shape of the connector 3 is shown with a broken line for reference. As described above, the second wall surface W2 and the fourth wall surface W4 have different depths in the upper region and the lower region of the hypotenuse f in FIG. 14, and thus the second wall surface W2 and the fourth wall surface W4 shown at the top and bottom of FIG. 15 are represented by two straight lines. That is, the inner straight line indicates the lower region of the hypotenuse f, and the outer straight line indicates the upper region of the hypotenuse f. More specifically, the inner surface of the fourth wall surface W4 is the 4-1st surface W4-1, and the outer surface is the 4-2nd surface W4-2.

The distance between the connector 3 and the first wall surface W1 and the distance between the connector 3 and the third wall surface W3 are equal to the final thickness t1 of the seal member 3a. The lower region of the hypotenuse f on the second wall surface W2 and the fourth wall surface W4, for example, the distance between the 4-1st surface W4-1 and the connector 3 is equal to the final thickness t1 of the seal member 3a. The upper region of the hypotenuse f on the second wall surface W2 and the fourth wall surface W4, for example, the distance between the 4-2nd surface W4-2 and the connector 3 is longer than the initial thickness t0 of the seal member 3a, for example, L11 as in the first embodiment.

When the connector 3 is inserted into the opening 1a, the seal member 3a in contact with the first wall surface W1 and the third wall surface W3 is first compressed, and at the same time, the seal member 3a in contact with very small widths at both ends of the second wall surface W2 and the fourth wall surface W4 is compressed. Thereafter, when the insertion amount of the connector 3 into the opening 1a increases, the seal member 3a in contact with the hypotenuse f of the second wall surface W2 and the fourth wall surface W4 is compressed. The position where the seal member 3a is compressed moves from both ends of the second wall surface W2 and the fourth wall surface W4 to the center as the insertion amount increases. When the seal member 3a is compressed at the center in the width direction of the second wall surface W2 and the fourth wall surface W4, the entire periphery of the seal member 3a is compressed. If the insertion amount is further increased from there, dynamic friction is generated on the entire periphery of the seal member 3a, so that a reaction force P2 is generated as in the first and second embodiments.

The third embodiment described above has the following operation effect.

(5) The cross-section of the opening 1a is a rectangle which is a kind of polygon. Of the plurality of wall surfaces of the opening 1a corresponding to each side of the rectangle, that is, of the first wall surface W1 to the fourth wall surface W4, the second wall surface W2 and the fourth wall surface are stepped surfaces. Of the stepped surface, the fourth wall surface W4 includes a 4-1st surface W4-1 including the Z direction, a 4-2nd surface W4-2 parallel to the 4-1st surface W4-1 and arranged on an outer peripheral side of the opening 1a than the 4-1st surface W4-1, and a boundary part which is the boundary between the 4-1st surface W4-1 and the 4-2nd surface W4-2, that is, the hypotenuse f. On the fourth wall surface W4, the proportion of the 4-2nd surface W4-2 decreases in the Z direction, and only the 4-1st surface W4-1 is ultimately present. Specifically, only the 4-1st surface W4-1 is present after the position advanced by the distance L12 from the entrance of the Z direction of the opening 1a.

Fourth Embodiment

A fourth embodiment of the electronic control device will be described with reference to FIGS. 16 to 17. In the following description, the same reference numerals are denoted on the same components as those of the third embodiment, and the differences will be mainly described. The points that are not particularly described are the same as those in the third embodiment. The present embodiment is different from the third embodiment mainly in the shape of the hypotenuse f and the processed surface. The second wall surface W2 and the fourth wall surface are stepped surfaces in the third embodiment, but only the fourth wall surface W4 is a stepped surface in the present embodiment.

Figure 16:
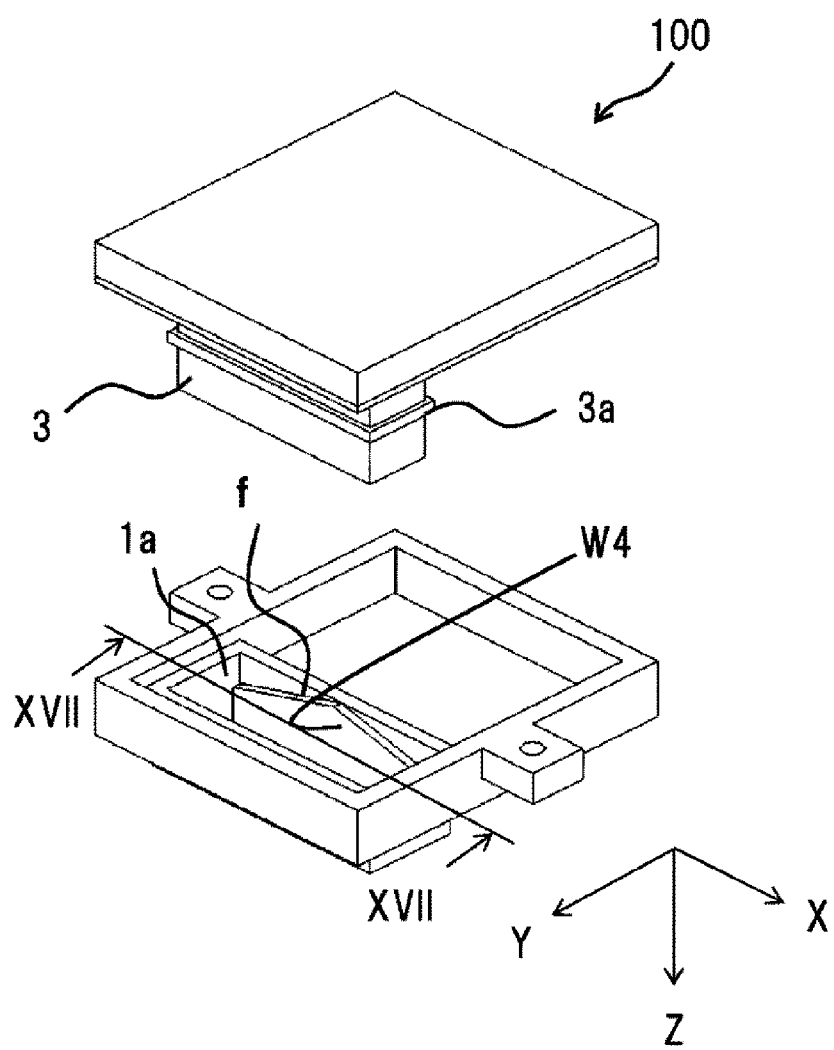
FIG. 16 is a perspective view in which only a cover 1 of the electronic control device 100 according to a fourth embodiment is separated.

FIG. 16 is a perspective view in which only the cover 1 of the electronic control device 100 according to the fourth embodiment is separated. That is, FIG. 16 corresponds to FIG. 3 in the first embodiment. The first wall surface W1 and the third wall surface W3 are the same as those in the first to third embodiments, and the second wall surface W2 and the fourth wall surface W4 are different from those in the first embodiment. The second wall surface W2 in the present embodiment is not processed in the same manner as the first wall surface W1 and the third wall surface W3. The fourth wall surface W4 has a hypotenuse f whose shape is different from that of the third embodiment. A cross-section that is perpendicular to the Y axis and passes through the center of the opening 1a in the Y direction is referred to as a XVII-XVII cross-section.

Figure 17:
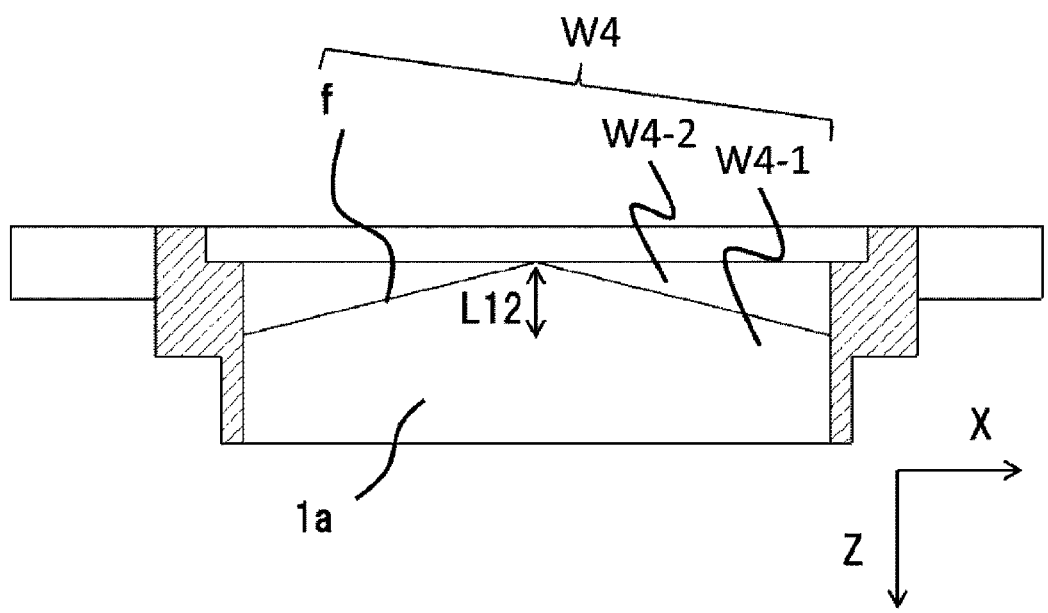
FIG. 17 is a cross-sectional view taken along line XVII-XVII in FIG. 16.

FIG. 17 is a cross-sectional view taken along the XVII-XVII cross-section in FIG. 16, and mainly shows the fourth wall surface W4. The difference from the fourth wall surface W4 in the third embodiment shown in FIG. 14 is the shape of the hypotenuse f. In the third embodiment, the hypotenuse f is a straight line connecting the left and right ends of the upper part of the fourth wall surface W4 in the figure to substantially the center in the height direction of the center in the figure. The hypotenuse f in the present embodiment is a straight line connecting the center of the upper part of the fourth wall surface W4 and substantially the center in the height direction of the left and right ends. The height of the left and right ends of the hypotenuse f is, for example, a position advanced by a distance L12 in the Z direction from the entrance of the opening 1a. The 4-1st surface W4-1 and the 4-2nd surface W4-2 divided by the hypotenuse f are similar to the third embodiment in that the depth is constant in the respective regions and that the 4-2nd surface W4-2 has more depth than the 4-1st surface.

When the connector 3 is inserted into the opening 1a, the seal member 3a in contact with the first wall surface W1, the second wall surface W2 and the third wall surface W3 is first compressed, and at the same time, the seal member 3a in contact with very small widths at the center in the width direction of the fourth wall surface W4 is compressed. Thereafter, when the insertion amount of the connector 3 into the opening 1a increases, the seal member 3a in contact with the hypotenuse f of the fourth wall surface W4 is compressed. The position where the seal member 3a is compressed moves from the center of the fourth wall surface W4 to both ends as the insertion amount increases. When the seal member 3a is compressed at both ends of the fourth wall surface W4, the entire periphery of the seal member 3a is compressed. If the insertion amount is further increased from there, dynamic friction is generated on the entire periphery of the seal member 3a, so that a reaction force P2 is generated as in the first to third embodiments.

The fourth embodiment described above has the following operation effect.

(6) The hypotenuse f, which is the boundary part, is a straight line connecting the center in the width direction of the fourth wall surface W4 at the entrance in the Z direction of the opening 1a and the end in the width direction of the fourth wall surface W4 at a position advanced by a distance L12 in the Z direction from the entrance. Therefore, stress is first generated at the center in the width direction of the fourth wall surface W4. Generally, when fixing the circuit substrate 5, both ends are often fixed, and in the present embodiment, the circuit substrate 5 is fixed to the base 7 with the screw 2. Therefore, strain is already generated at both ends of the circuit substrate 5 by the screw 2, and it is not preferable to cause further strain at both ends thereof.

According to the configuration of the present embodiment, the strain generated at both ends of the circuit substrate 5 can be reduced by generating the strain at the center in the width direction of the fourth wall surface W4.

Fifth Embodiment

A fifth embodiment of the electronic control device will be described with reference to FIGS. 18 to 19. In the following description, the same reference numerals are denoted on the same components as those of the first embodiment, and the differences will be mainly described. The points that are not particularly described are the same as those in the first embodiment. The present embodiment is different from the fourth embodiment mainly in that the shape of the hypotenuse f is different from that in the third embodiment, and that the second wall surface W2 also has the same shape as the fourth wall surface W4.

Figure 18:
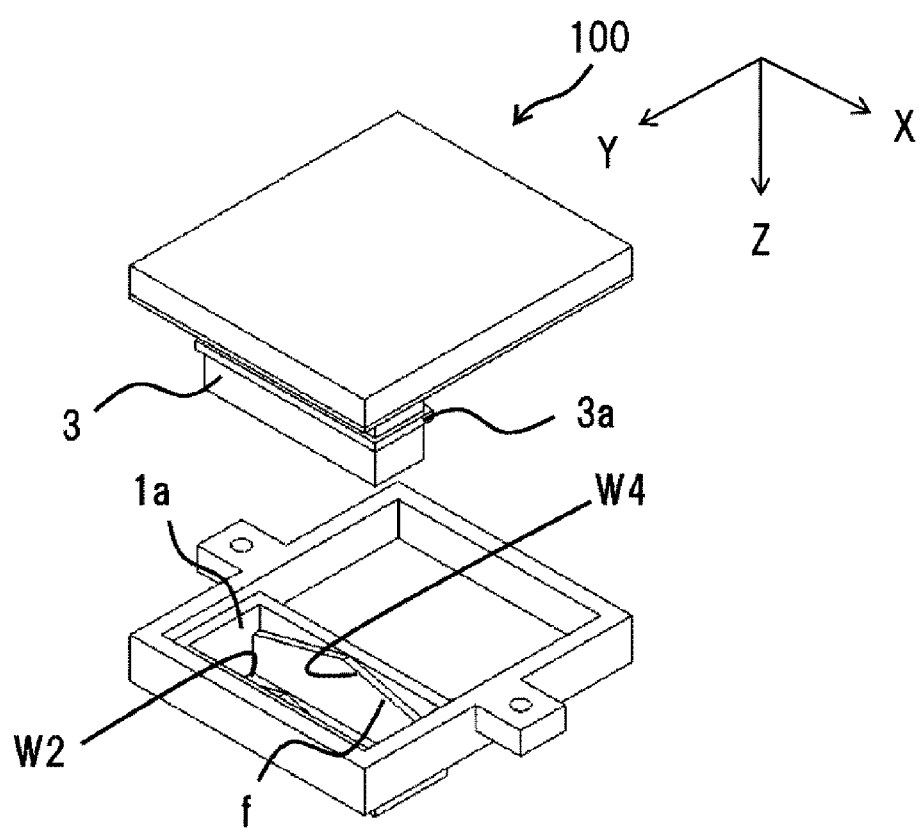
FIG. 18 is a perspective view in which only a cover 1 of the electronic control device 100 according to a fifth embodiment is separated.
Figure 19:
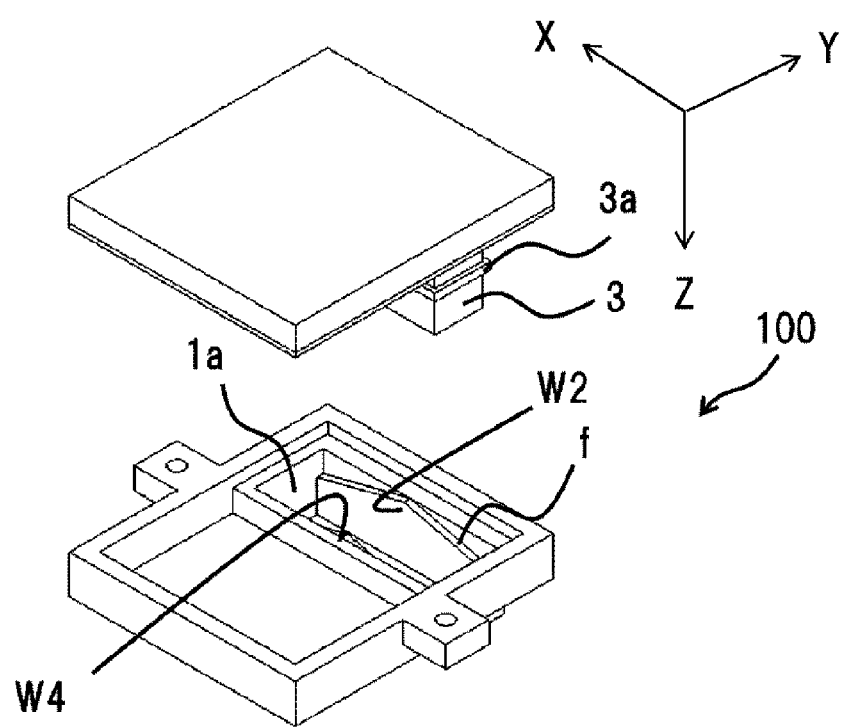

FIGS. 18 and 19 are perspective views in which only the cover 1 of the electronic control device 100 according to the fourth embodiment is separated. FIG. 18 corresponds to FIG. 3 in the first embodiment. FIG. 19 is a view in which FIG. 18 is rotated by 180 degrees around the Z axis. In FIG. 18, the shape of the second wall surface W2, which is the wall surface on the front side of the opening 1a, is hidden and not shown, but the shape of the second wall surface W2 is clearly shown in FIG. 19 rotated by 180 degrees. In the present embodiment, since the reaction force applied to the connector 3 is left-right symmetrical, the connector 3 is less likely to be obliquely inserted into the cover 1 as compared with the fourth embodiment, and the assembly of the electronic control device 100 is facilitated.

The fifth embodiment described above has the following operation effect.

(7) The cross-section of the opening 1a is composed of two sets of parallel sides, and the wall surfaces corresponding to the one set of sides parallel to the X axis, that is, the second wall surface W2 and the fourth wall surface W4 are stepped surfaces. Therefore, when the connector 3 is inserted into the opening 1a, it can be pressed uniformly from both sides.

Sixth Embodiment

A sixth embodiment of the electronic control device will be described with reference to FIGS. 20 to 23. In the following description, the same reference numerals are denoted on the same components as those of the fifth embodiment, and the differences will be mainly described. The points that are not particularly described are the same as those in the fifth embodiment. The present embodiment is different from the first embodiment mainly in that the first wall surface W1 and the third wall surface W3 are also processed in the same manner as the second wall surface W2 and the fourth wall surface W4.

Figure 20:
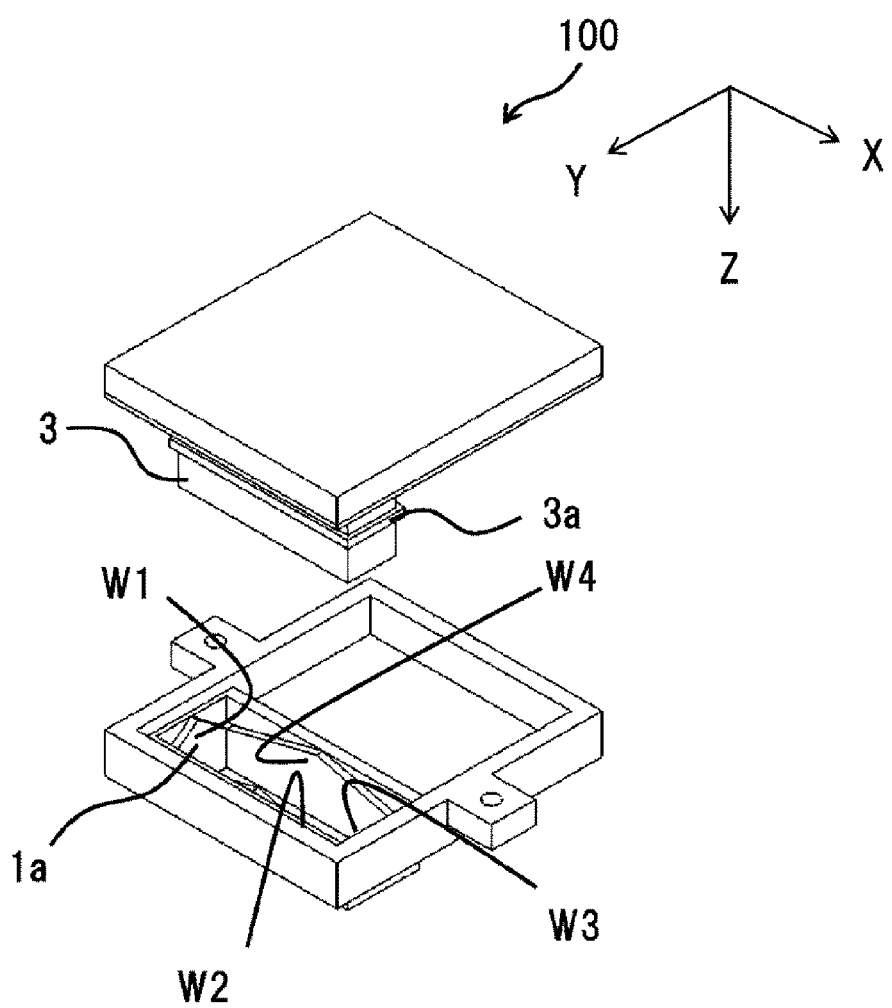
FIG. 20 is a perspective view in which only a cover 1 of the electronic control device 100 according to a sixth embodiment is separated.
Figure 21:
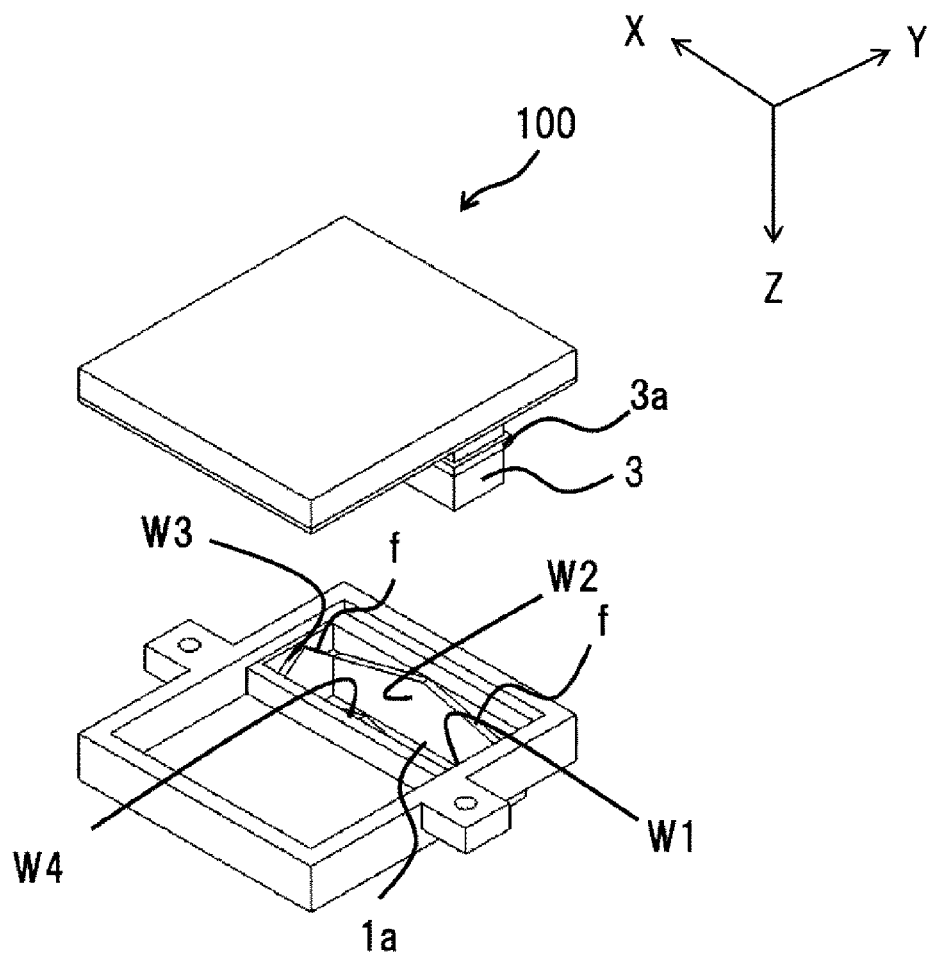

FIGS. 20 and 21 are perspective views in which only the cover 1 of the electronic control device 100 according to the sixth embodiment is separated. FIG. 20 corresponds to FIG. 3 in the first embodiment. FIG. 21 is a view in which FIG. 20 is rotated by 180 degrees around the Z axis. In FIG. 20, the shapes of the second wall surface W2 and the third wall surface W3, which are the wall surfaces on the front side of the opening 1a, are hidden and not shown, but the shapes of the second wall surface W2 and the third wall surface W3 are clearly shown in FIG. 21 rotated by 180 degrees. As shown in FIGS. 20 and 21, in the present embodiment, hypotenuse f is formed on all the wall surfaces of first wall surface W1 to fourth wall surface W4.

In all the wall surfaces of the first wall surface W1 to the fourth wall surface W4, the hypotenuse f is a straight line connecting the center at the upper part of each wall surface and substantially the center in the height direction of the left and right ends. The height of the left and right ends of the hypotenuse f is, for example, a position advanced by a distance L12 in the Z direction from the entrance of the opening 1a. The heights of the left and right ends of the hypotenuse f do not have to be common to all four wall surfaces, but it is desirable that they be common to the two opposing surfaces. On each of the four wall surfaces, the two regions divided by the hypotenuse f have a constant depth in each region. The region at the upper part of the hypotenuse f, that is, the region having a smaller Z-axis value in the regions divided by the hypotenuse f has more depth than the region at the lower part of the hypotenuse f.

Figure 22:
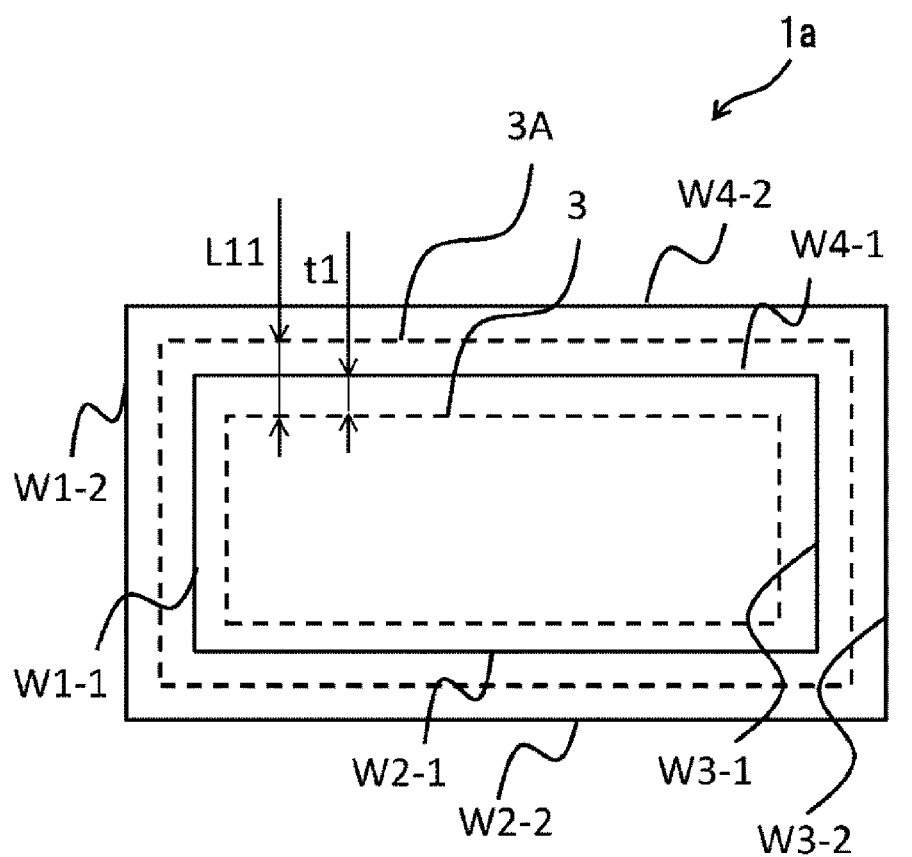
FIG. 22 is a plan view of the opening 1a according to the sixth embodiment.

FIG. 22 is a plan view of the opening 1a. In FIG. 22, the outer shape of the connector 3 is shown with a broken line for reference. Furthermore, the outer peripheral portion of the seal member 3a in the uncompressed state is indicated with the reference numeral 3A by a broken line. The first wall surface W1 is divided into a 1-1st surface W1-1 and a 1-2nd surface W1-2 by the hypotenuse f. The second wall surface W1 is divided into a 2-1st surface W2-1 and a 2-2nd surface W2-2 by the hypotenuse f.

The third wall surface W1 is divided into a 3-1st surface W3-1 and a 3-2nd surface W3-2 by the hypotenuse f. The 1-2nd surface W1-2, the 2-2nd surface W2-2, the 3-2nd surface W3-2, and the 4-2nd surface W4-2 respectively exist on the outer side of the connector 3 than each of the 1-1st surface W1-1, the 2-1st surface W2-1, the 3-1st surface W3-1, and the 4-1st surface W4-1.

As shown in FIG. 22, the rectangle on the outermost side formed by the 1-2nd surface W1-2, the 2-2nd surface W2-2, the 3-2nd surface W3-2, and the 4-2nd surface W4-2 is larger than the rectangle of reference numeral 3A indicating the outer peripheral portion of the seal member 3a in the uncompressed state. That is, at the entrance of the opening 1a in the Z direction, the hollow region of the opening 1a is larger than the outer shape of the seal member 3a in the uncompressed state, and does not come into contact at the entrance of the opening 1a.

Figure 23:
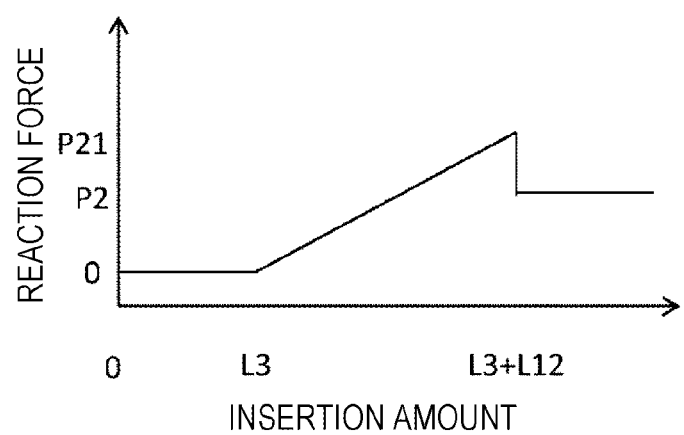
FIG. 23 is a conceptual diagram showing a schematic relationship between the insertion amount of the connector 3 into the opening 1a and the reaction force in the sixth embodiment.

FIG. 23 is a conceptual diagram showing a schematic relationship between the insertion amount of the connector 3 into the opening 1a and the reaction force received by the connector 3 due to the insertion in the process of manufacturing the electronic control device 100 according to the sixth embodiment. However, in the example shown in FIG. 23, the heights of the left and right ends of the hypotenuse f on all the wall surfaces are at positions advanced by a distance L12 in the Z direction from the entrance of the opening 1a. The following is a description of FIG. 23.

Since the distance from the tip of the connector 3 to the seal member 3a is L3, the seal member 3a does not come into contact with the inner peripheral surface of the opening 1a when the insertion amount is less than L3. Therefore, the reaction force is zero when the insertion amount is less than L3. When the insertion amount is L3, the top of the hypotenuse f and the seal member 3a come into contact with each other at the center in the width direction of all the wall surfaces of the first wall surface W1 to the fourth wall surface W4. When a force is applied to the connector 3 in the positive direction of the Z axis in this state, the seal member 3a in contact with the center part of each wall surface, which is the top of the hypotenuse f, is compressed and crushed.

For a while thereafter, even if the insertion amount is increased, the hypotenuse f and the seal member 3a come into contact with each other at two points on each wall surface, and the force required to compress the seal member 3a is constant. However, since the contact area between the seal member 3a and each wall surface increases, the reaction force continues to increase. When the insertion amount reaches L3+L12 thereafter, the entire periphery of the seal member 3a is crushed and comes into contact with the opening 1a, and the seal member 3a is not compressed any further, so that the reaction force is only the frictional force. The reaction force at this time is P2 as in the first embodiment.

The sixth embodiment described above has the following operation effect.

(8) All the wall surfaces, the first wall surface W1 to the fourth wall surface W4, are stepped surfaces. Therefore, the maximum reaction force generated by inserting the connector 3 into the opening 1a can be reduced as small as possible.

The embodiments described above and the modified examples may be combined. Although various embodiments and modified examples have been described above, the present invention is not limited to the contents thereof. Other modes that can be considered within the scope of the technical idea of the present invention are also encompassed within the scope of the present invention.

REFERENCE SIGNS LIST 1a opening
3 connector
4 electronic component
5 circuit substrate
100 electronic control device
F hypotenuse
W1 first wall surface
W2 second wall surface
W3 third wall surface
W4 fourth wall surface

The invention claimed is:

1. An electronic control device comprising:
   a cover having a hollow opening;
   a connector inserted into the opening; and
   a seal member having compressibility that is arranged in contact with a first position of an inner peripheral portion of the opening and that comes into close contact with the inner peripheral portion of the opening and the connector in a compressed state; wherein
   the opening has a thickness in a first direction which is a direction in which the connector is inserted;
   an area of a hollow region which is a hollow region of the opening is reduced or maintained along the first direction;
   the seal member is arranged on an outer peripheral portion of the connector and inserted in the first direction to the opening together with the connector; and
   an area of the hollow region at the first position is smaller than an area of the hollow region at an entrance of the opening in the first direction,
   wherein the hollow region has a spread in a second direction perpendicular to the first direction, and a third direction perpendicular to the first direction and the second direction; and
   wherein comparing the hollow region at the entrance of the opening in the first direction and a region of an outer shape of the seal member in an uncompressed state arranged on an outer periphery of the connector, a magnitude relationship of a reaction force received by the connector due to the insertion process of the connector into the opening in the second direction and a magnitude relationship of the reaction force received by the connector due to the insertion process of the connector into the opening in the third direction are different.

2. The electronic control device according to claim 1, wherein
   a shape of the inner peripheral portion of the opening has a plane symmetrical shape with a plane including the first direction as a plane of symmetry.

3. The electronic control device according to claim 1, wherein
   the area of the hollow region of the opening continuously decreases in the first direction in a predetermined zone in the first direction.

4. The electronic control device according to claim 3, wherein
   a cross-section of the opening is a polygon, at least one of a plurality of inner wall surfaces of the opening corresponding to each side of the polygon being a stepped surface; and
   the stepped surface includes a first surface including the first direction, a second surface parallel to the first surface and arranged closer to the outer peripheral side of the opening than the first surface, and a boundary part that is a boundary of the first surface and the second surface, a proportion of the second surface decreasing in the first direction.

5. The electronic control device according to claim 4, wherein
   the boundary part is a straight line that connects a center in a width direction of the inner wall surface at an entrance in the first direction and an end in the width direction of the inner wall surface advanced by a predetermined distance in the first direction.

6. The electronic control device according to claim 4, wherein
   a cross-section of the opening is composed of a plurality of sets of parallel sides, and the inner wall surface corresponding to at least one set of sides of the plurality of sets is the stepped surface.

7. An electronic control device comprising:
   a cover having a hollow opening;
   a connector inserted into the opening; and
   a seal member having compressibility that is arranged in contact with a first position of an inner peripheral portion of the opening and that comes into close contact with the inner peripheral portion of the opening and the connector in a compressed state; wherein
   the opening has a thickness in a first direction which is a direction in which the connector is inserted;
   an area of a hollow region which is a hollow region of the opening is reduced or maintained along the first direction;
   the seal member is arranged on an outer peripheral portion of the connector and inserted in the first direction to the opening together with the connector; and
   an area of the hollow region at the first position is smaller than an area of the hollow region at an entrance of the opening in the first direction,
   wherein a cross-section of the opening is a polygon, at least one of a plurality of inner wall surfaces of the opening corresponding to each side of the polygon being a stepped surface; and
   the stepped surface includes a first surface including the first direction, a second surface parallel to the first surface and arranged closer to the outer peripheral side of the opening than the first surface, and a boundary part that is a boundary of the first surface and the second surface, a proportion of the second surface decreasing in the first direction.

* * * * *